US006433578B1

(12) United States Patent
Wasson

(10) Patent No.: US 6,433,578 B1
(45) Date of Patent: Aug. 13, 2002

(54) HETEROGENEOUS PROGRAMMABLE GATE ARRAY

(75) Inventor: Stephen L. Wasson, Boulder Creek, CA (US)

(73) Assignee: Morphics Technology, Inc., Campbell, CA (US)

( * ) Notice: Subject to any disclaimer, the term of this patent is extended or adjusted under 35 U.S.C. 154(b) by 0 days.

(21) Appl. No.: 09/565,648

(22) Filed: May 5, 2000

Related U.S. Application Data
(60) Provisional application No. 60/133,145, filed on May 7, 1999.

(51) Int. Cl.[7] .............................................. H03K 19/177
(52) U.S. Cl. .......................................... 326/38; 326/41
(58) Field of Search ..................................... 326/37–41

(56) References Cited

U.S. PATENT DOCUMENTS

| 4,935,734 A | | 6/1990 | Austin ..................... 340/825.83 |
| 5,329,470 A | | 7/1994 | Sample et al. .............. 364/578 |
| 5,362,999 A | | 11/1994 | Chiang ........................ 326/44 |
| 5,640,107 A | | 6/1997 | Kruse |
| 5,677,638 A | * | 10/1997 | Young et al. ................. 326/39 |
| 5,723,984 A | | 3/1998 | Sharpe-Geisler |
| 5,744,980 A | | 4/1998 | McGowan et al. |
| 5,761,484 A | | 6/1998 | Agarwal et al. ............ 395/500 |
| 5,796,269 A | | 8/1998 | New |
| 5,796,623 A | | 8/1998 | Butts et al. ................. 364/489 |
| 5,825,202 A | | 10/1998 | Tavana et al. ................ 326/39 |
| 5,874,834 A | | 2/1999 | New |
| 5,910,733 A | | 6/1999 | Bertolet et al. |
| 5,943,242 A | | 8/1999 | Vorbach et al. ............. 364/491 |
| 5,946,219 A | | 8/1999 | Mason et al. ............... 364/489 |
| 5,977,791 A | | 11/1999 | Veenstra |
| 6,005,410 A | | 12/1999 | Laramie |
| 6,020,776 A | | 2/2000 | Young |
| 6,021,490 A | | 2/2000 | Vorbach et al. ............. 713/100 |
| 6,075,380 A | | 6/2000 | Lane |
| 6,091,263 A | * | 7/2000 | New et al. ..................... 326/41 |
| 6,154,052 A | * | 11/2000 | New ............................ 326/41 |

FOREIGN PATENT DOCUMENTS

| EP | 0 910 027 A2 | 4/1999 |
| WO | WO 98/21725 A2 | 5/1998 |
| WO | WO 99/56394 | 11/1999 |

\* cited by examiner

Primary Examiner—Don Phu Le
(74) Attorney, Agent, or Firm—Pennie & Edmonds LLP

(57) ABSTRACT

A heterogeneous programmable gate array has an unstructured logic sub-array and a structured logic sub-array. An unstructured input/output interconnect structure delivers unstructured-to-unstructured input/output signals to the unstructured logic sub-array, while a bussed input/output interconnect structure delivers structured-to-structured input/output signals to the structured logic sub-array. A control signal bus is connected between the unstructured logic sub-array and the structured logic sub-array to deliver unstructured source signals therebetween. A bussed signal bus is connected between the unstructured logic sub-array and the structured logic sub-array to deliver structured source signals therebetween.

9 Claims, 18 Drawing Sheets

□ Logic Cell
▣ Control
▦ DataPath

Four flip-flops with a commom 'clock enable'

Each datapath source d[7:0] is routed to a large number (12) of destinations.
Each control signal c[0:11] is routed to a relatively large number (8) of destinations.

HETEROGENEOUS PROGRAMMABLE GATE ARRAY

This application claims priority to the provisional application bearing serial No. 60/133,145 filed on May 7, 1999.

BRIEF DESCRIPTION OF THE INVENTION

This invention relates generally to programmable logic devices. More particularly, this invention relates to heterogeneous programmable gate arrays.

BACKGROUND OF THE INVENTION

Programmable logic devices are widely used in the electronics industry. Contemporary programmable logic devices typically comprise an homogeneous, general-purpose logic array. Also, contemporary use typically requires various programmable logic devices to serve multiple purposes. Instead of designing specific gate arrays for each purpose, multiple homogeneous programmable gate arrays are programmed to serve each required purpose. Field programmable gate arrays (FPGAs) are typically used for these purposes.

To date, the relevant industry has significantly invested in developing "optimum" homogeneous architectures that can be programmed to serve most purposes. Using homogeneous FPGAs can be very inefficient when the programmed logic function is complex or when the programmed logic function properties are heterogeneous in nature. Inefficient device utilization results when inevitably parts of the homogeneous architecture will be wasted because they are not needed for a specific purpose. As shown with line 20 in FIG. 1, random/control logic functions will only result in high utilization when implemented in minimal structure devices, whereas, as shown with line 22, structured/datapath logic functions will only result in high utilization when implemented in maximal structure devices. For example, parity trees and state machines have high utilization in minimal structure arrays, and arithmetic and register file functions have high utilization in maximal structure arrays. However, in a minimal structure device, utilization efficiency drastically decreases as the degree of implemented function structure increases. Conversely, in a maximal structure device, utilization efficiency drastically decreases as the degree of implemented function structure decreases. Random/control and structured/datapath are complementary, heterogeneous properties.

FPGAs typically comprise a homogeneous logic block array suitable for implementing some random/control and some structure/datapath functions. Further, current practices often use separate devices for unstructured logic and structured logic functions. The use of separate devices requires increased manufacturing and packaging costs as well as a relatively large amount of space when mounted on a circuit board. The spatial inefficiency reduces computational speed as signals are passed between resources.

In view of the foregoing, it would be highly desirable to provide an improved programmable logic device that has unstructured logic and structured logic resources on the same device.

SUMMARY OF THE INVENTION

A heterogeneous programmable gate array (HPGA) comprises two or more arrays. In the preferred embodiment, a HPGA comprises at least one unstructured logic array and at least one structured logic array. An unstructured input/output interconnect structure delivers unstructured-to-unstructured input/output signals to the unstructured logic array, while a bussed input/output interconnect structure delivers structured-to-structured input/output signals to the structured logic array. A control signal bus is functionally connected between the unstructured logic array and the structured logic array to deliver unstructured source signals therebetween. A bussed signal bus is functionally connected between the unstructured logic array and the structured logic array to deliver structured source signals therebetween.

A logic function is "unstructured" if either the type of logic or routing resources required to implement the function does not exhibit regularity or uniformity. For example, a state machine comprises various state functions in which a next-state function is typically independent of other state functions; thus, various states in the state machine are typically not physically aligned with each other. A logic function is "structured" if the logic and routing resources required to implement the function exhibit regularity or uniformity. For example, a datapath object, such as a loadable counter, comprises a repetition of a bit-slice function. In other words, the next-state function is typically identical for all the bit-slice functions. Further, each bit slice receives the same clock-enable and load control signals; thus, each bit has an inherent relationship with respect to each other and should be physically aligned with each other. For example, bit i should be situated between bit i−1 and i+1. Generally, unstructured logic is the complement of structured logic.

In another exemplary embodiment, a heterogeneous programmable array comprises sections having at least two sub-sections that have complementary logic and route resource properties. The sub-sections are configured to specifically optimize the complementary logic, such as unstructured/control logic and structured/datapath logic, respectively. In a preferred embodiment, the sub-sections are configured to include approximately one-third unstructured/control logic and approximately two-thirds structured/datapath logic. The unstructured/control logic is generally fine-grained, short, with low-fanout, and high-skew. The structured/datapath logic is generally medium-grained, long, with high-fanout, and low-skew. Examples of unstructured/control logic are glue logic, decoders, parity trees, and state machines. Examples of structured/datapath logic are registers, arithmetic devices, register files, random access memories, and first-in-first-out modules.

The device in accordance with the invention provides a platform for disparate programmable logic and routing resources. The topology facilitates superior partitioning of contemporary netlists. That is, logic netlists can be partitioned into fragments targeting specific array resources. Appropriate partitioning results in significantly increased device utilization and system performance. In addition, the apparatus improves overall device efficiency because arrays can be optimized for specific purposes.

DETAILED DESCRIPTION OF THE INVENTION

Figure 1:
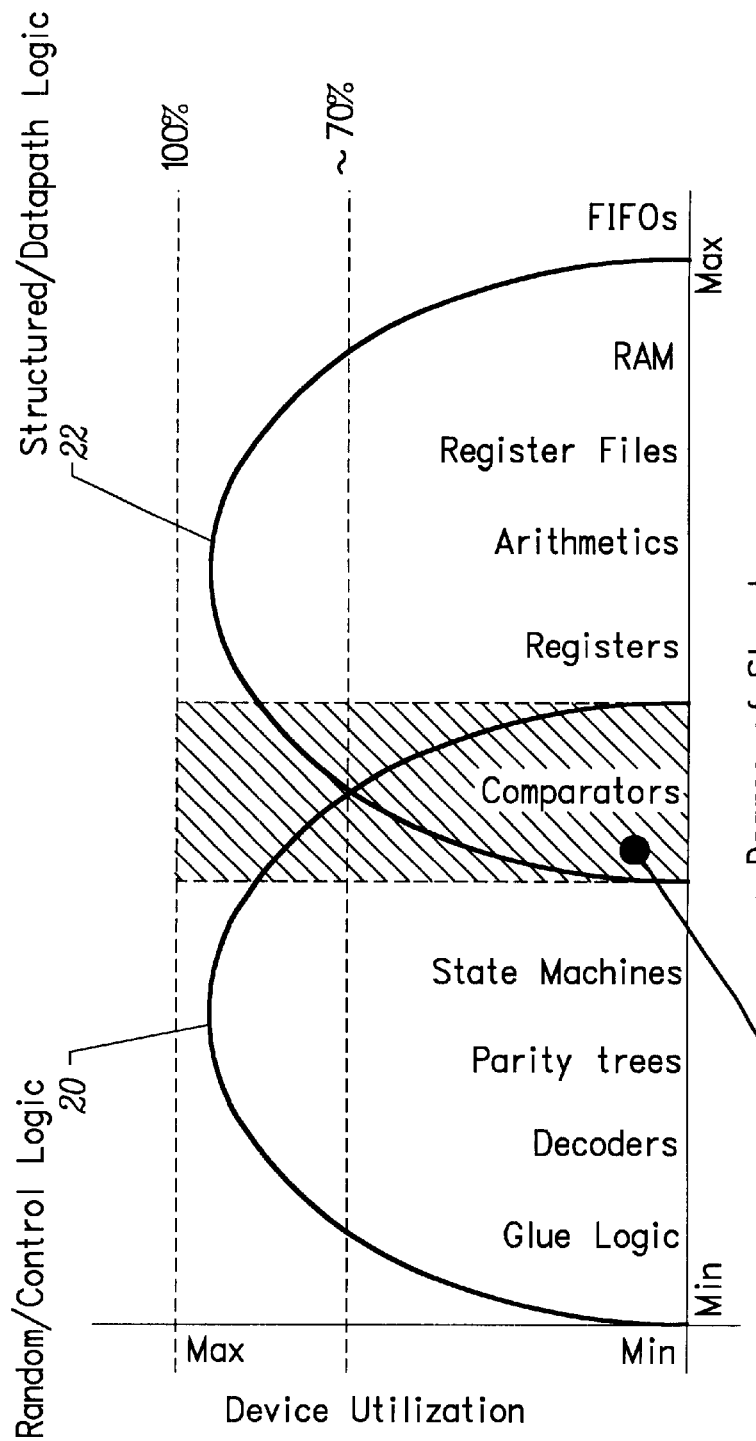
FIG. 1 is a diagram illustrating the inefficiencies resulting from using prior art homogeneous arrays.
Figure 2:
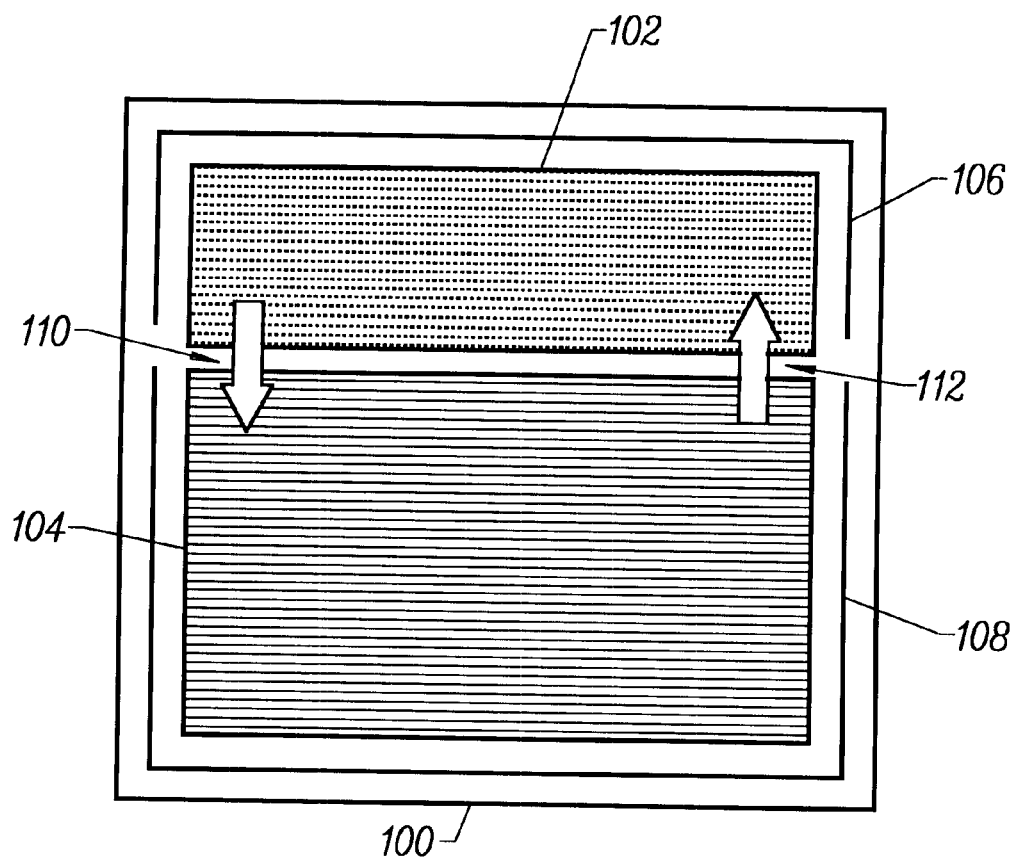
FIG. 2 illustrates a heterogeneous programmable gate array device constructed in accordance with an embodiment of the invention.

FIG. 2 illustrates an exemplary module 100 of a heterogeneous programmable gate array in accordance with an embodiment of the invention. The module 100 includes an unstructured logic sub-section 102. As used herein, the term unstructured logic sub-section refers to logic resources that are wide and shallow or have fine granularity, and therefore are suitable for unstructured logic functions, such as state machines and decoders. The unstructured logic sub-section 102 is further characterized by routing resources that are dense, short, low fan-out, high skew, and single node in nature.

The module 100 also includes a structured logic sub-section 104. As used herein, the term structured logic sub-section refers to logic resources that are narrow and deep or have coarse granularity, and therefore are suitable for bus-oriented functions, such as arithmetic and random access memory ("RAM") blocks. The structured logic sub-section 104 is further characterized by routing resources that are sparse, long, high fan-out, low skew, and bussed signal in nature.

An unstructured input/output interconnect structure 106 is used to route unstructured-to-unstructured input/output signals within the unstructured logic sub-section. A bussed input/output interconnect structure 108 is used to route structured-to-structured input/output signals within the structured logic sub-section 104.

In accordance with an embodiment of the invention, a control signal bus 110 and a bussed signal bus 112 are formed along a common axis (i.e., in parallel). The control signal bus 110 is a programmable interconnect resource for unstructured source signals passed from the unstructured logic sub-section 102 to the structured logic sub-section 104. The bussed signal bus 112 is a programmable interconnect resource for structured source signals passed from the structured logic sub-section 104 to the unstructured logic sub-section 102.

Figure 3:
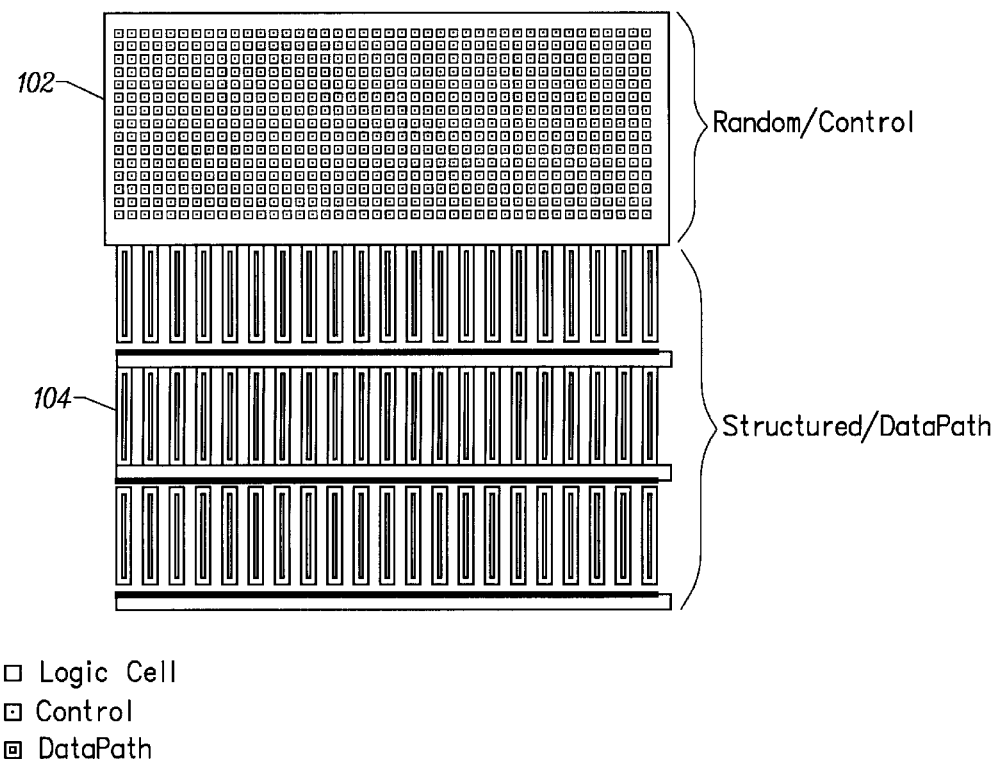
FIG. 3 illustrates an exemplary heterogeneous programmable gate array device in accordance with an embodiment of the invention.

FIG. 3 illustrates an exemplary embodiment of the module 100. As shown, the unstructured logic sub-section 102 has fine granularity and the structured logic sub-section 104 has coarse granularity. In one embodiment, the two sub-sections 102, 104 have complementary logic and route resource properties. One of the major obstacles to creating an appropriate HPGA architecture is striking a balance of unstructured-to-structured resources on the HPGA device. In a preferred embodiment, the module 100 comprises approximately one-third unstructured/control logic (unstructured sub-section 102) and approximately two-thirds structured/ datapath logic (structured sub-section 104). This division of resources has proven to be especially advantageous. Nevertheless, other resource divisions may also be utilized in accordance with the invention. For example, as the datapath gets wider, a structured/datapath logic region of approximately 75% or more may be desirable. Alternately, as the control logic becomes more complex, an unstructured/ control logic region of approximately 40% or more may be desirable. Random access memory (RAM) represents an extreme case in resource division. RAMs are gate intensive. When RAM is considered a part of the structured/datapath logic sub-section of the module 100, the ratio of structured versus unstructured logic in the module 100 should be approximately one-tenth unstructured/control logic to nine-tenths structured/datapath logic.

Figure 4:
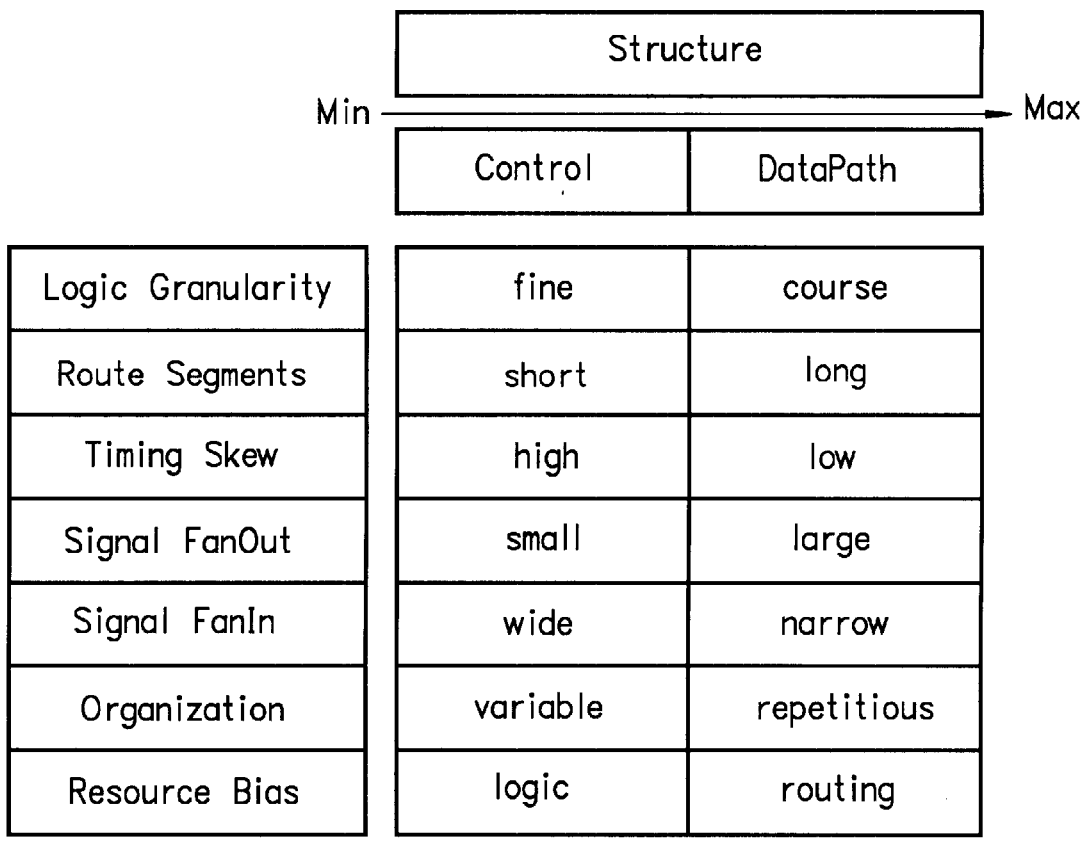
FIG. 4 is a table illustrating an exemplary list of attributes for structured/control logic and structured/datapath logic.

FIG. 4 is a table illustrating an exemplary list of attributes for characterizing logic as unstructured/control or structured/datapath logic. Unstructured/control logic typically has fine granularity, short route segments, high timing skew, small signal fan-out, wide signal fan-in variable organization, and logic resource bias. On the other hand, structured/datapath logic typically has coarse granularity, long route segments, low timing skew, large signal fan-out, narrow signal fan-in, repetitious organization, and routing resource bias.

Figure 5A:
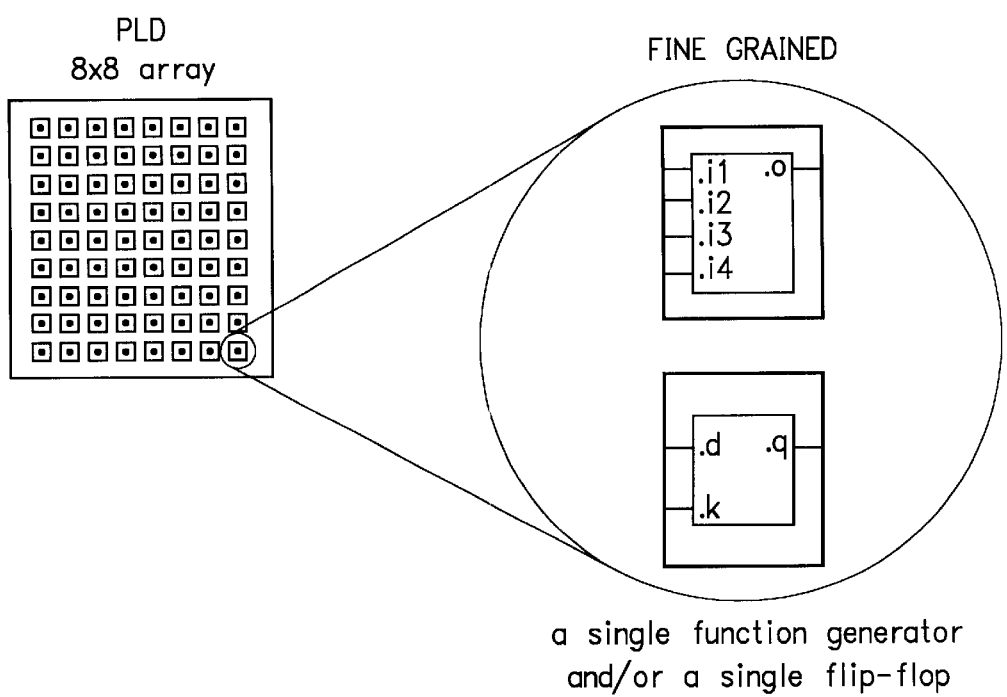
FIG. 5 illustrates an exemplary fine grained logic block.
FIG. 5B illustrates an exemplary medium grained logic block.
FIG. 5C illustrates an exemplary coarse grained logic block.
Figure 5B:
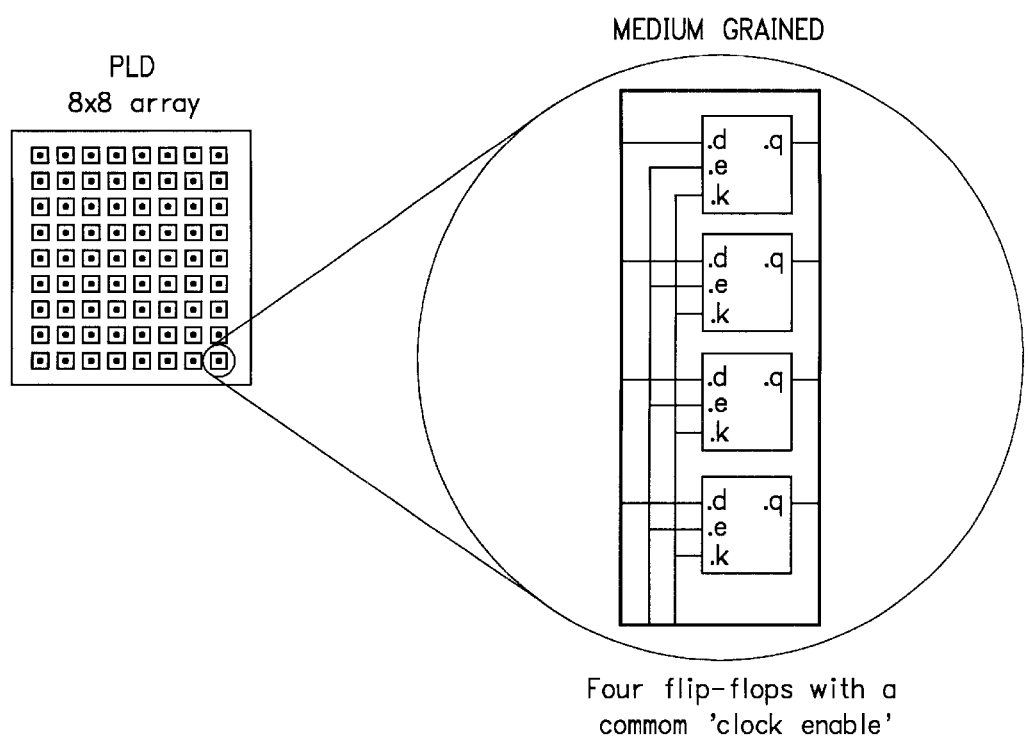
Figure 5C:
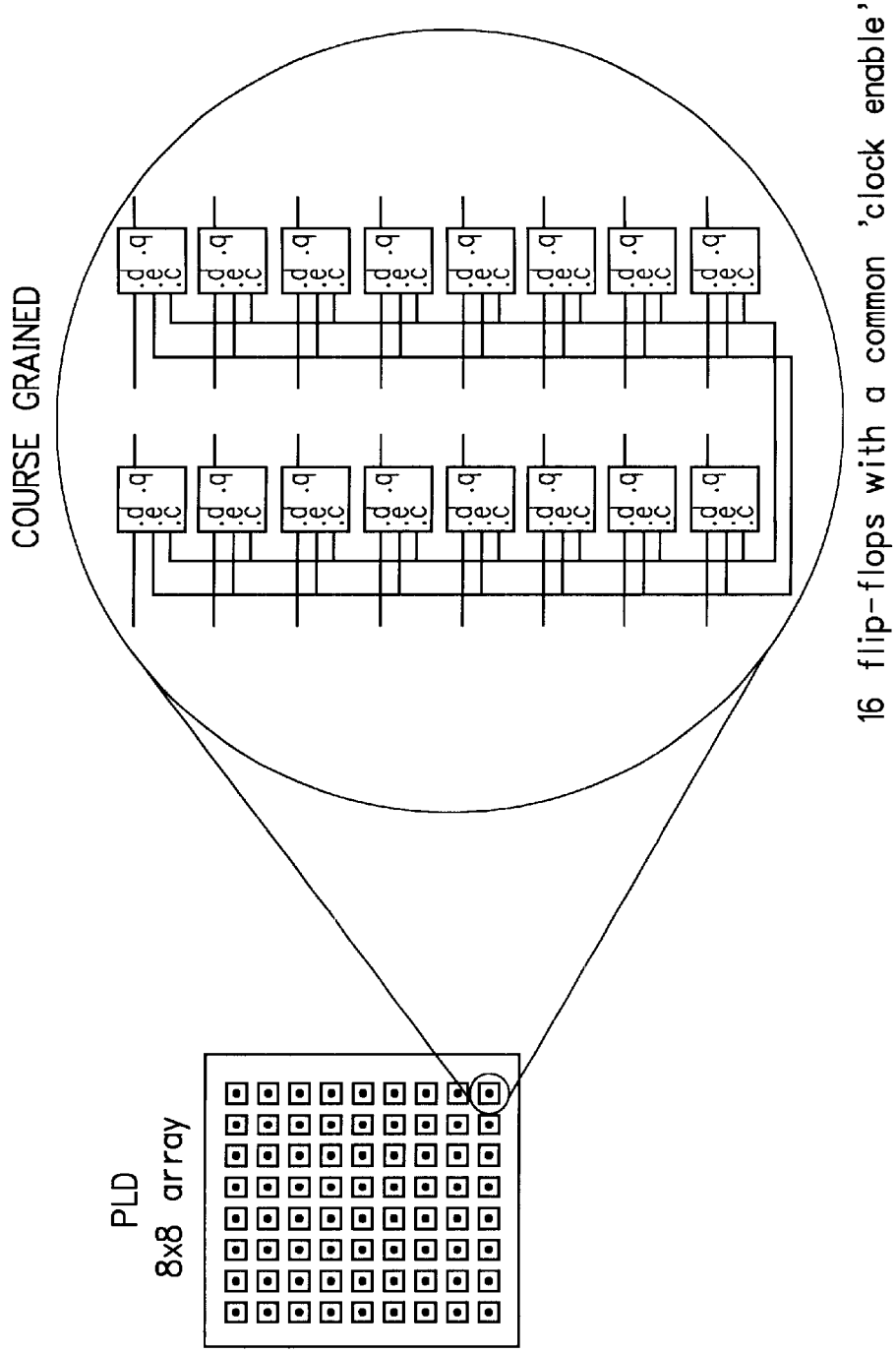

Logic granularity is a measure of the amount of logic within a block which is tied together by a common control. For example, a device having logic blocks with a small amount of combinational logic is said to be of fine granularity. A device having logic blocks with a large amount of combinational logic is said to be of coarse granularity. Whether a device is of fine or coarse granularity is dependent upon the device size and is relative to current technology advancement. For example, as shown in FIG. 5A, an 8-by-8 programmable logic device (or a module) is fine grained if each of its logic blocks includes a single function generator and/or a single flip-flop. In FIG. 5B, an 8-by-8 programmable logic device (or module) is medium grained if each of its logic blocks includes four flip-flops with a common clock enable signal. In FIG. 5C, an 8-by-8 programmable logic device (or module) is coarse grained if each of its logic blocks includes sixteen flip-flops with a common clock enable.

A routing segment of a device is short or long depending upon the device size. For example, in a small device (i.e., 16-by-16 matrix of logic blocks), a signal line which connects every fourth logic block may be considered a "medium" line, whereas in a large device (i.e., 64-by-64 matrix of logic blocks) the same signal line would be considered a "short" line.

Fan-out refers to the number of destinations to which a signal source is routed. Signal sources which are routed to a small number of destinations have a small fan-out. Signal sources which are routed to a large number of destinations have a large fan-out. Whether the fan-out is large or small is dependent upon the device size and function complexity. For example, control-to-control signals typically exhibit low fan-out, whereas control-to-datapath signals typically exhibit high fan-out.

Figure 6A:
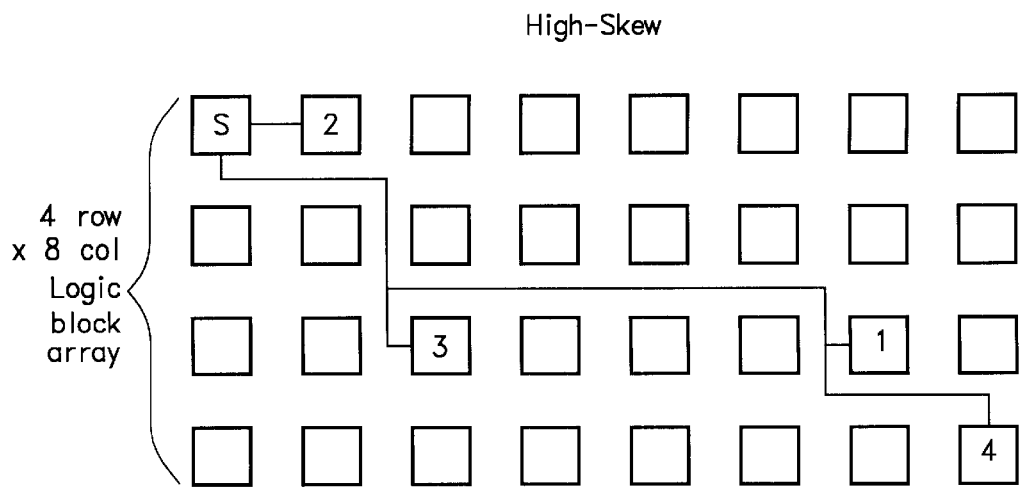
FIG. 6A illustrates an exemplary high-skew logic block array.

FIG. 6A is an example of low fan-out in a 4-by-8 logic block array where a source "S" is routed to only four destinations.

Figure 7:
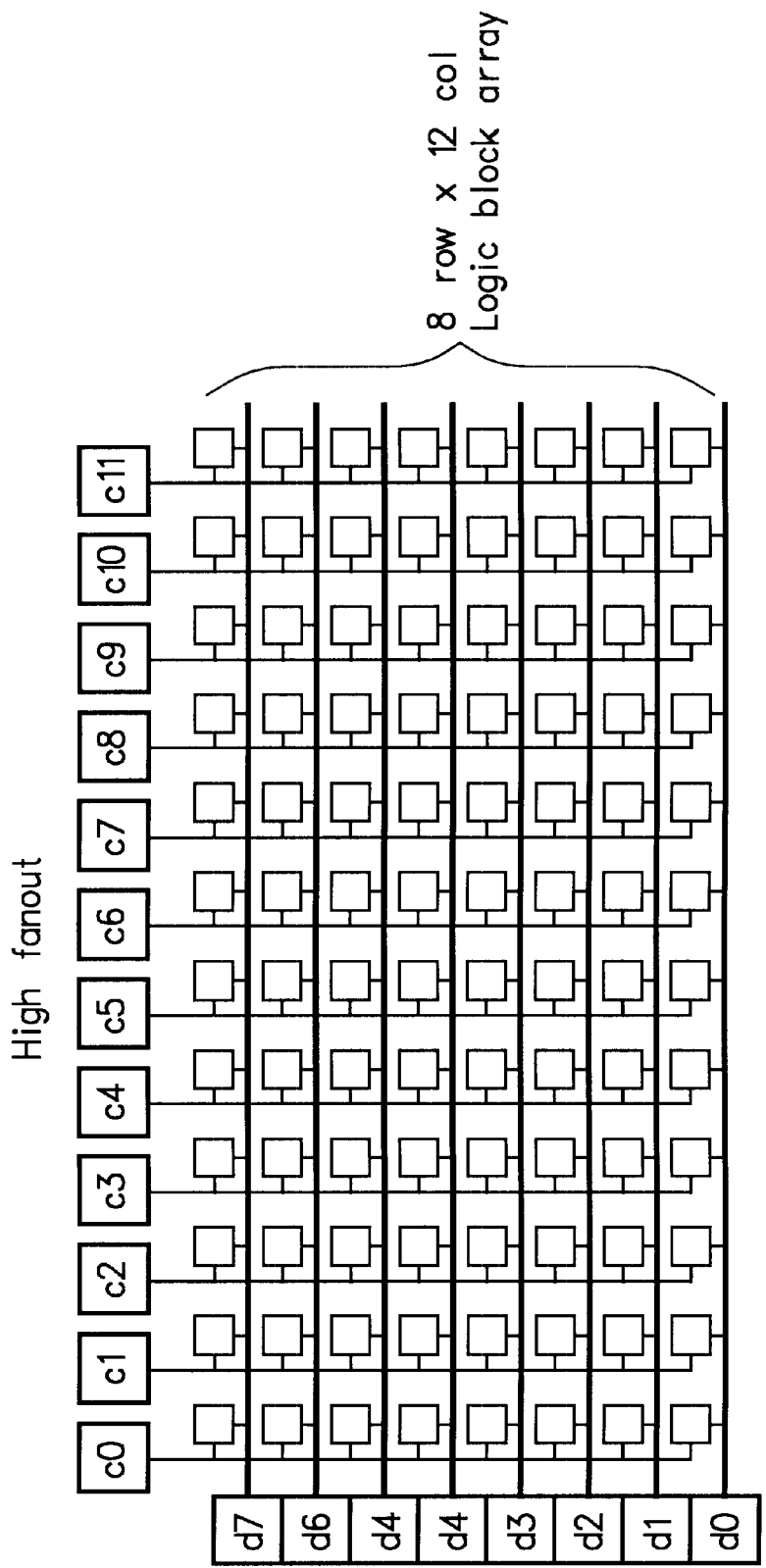
FIG. 7 illustrates an exemplary high fan-out logic block array.

FIG. 7 is an example of high fan-out in an eight-by twelve logic block array, where each source, for example, source d7, is routed to twelve destinations.

Figure 6B:
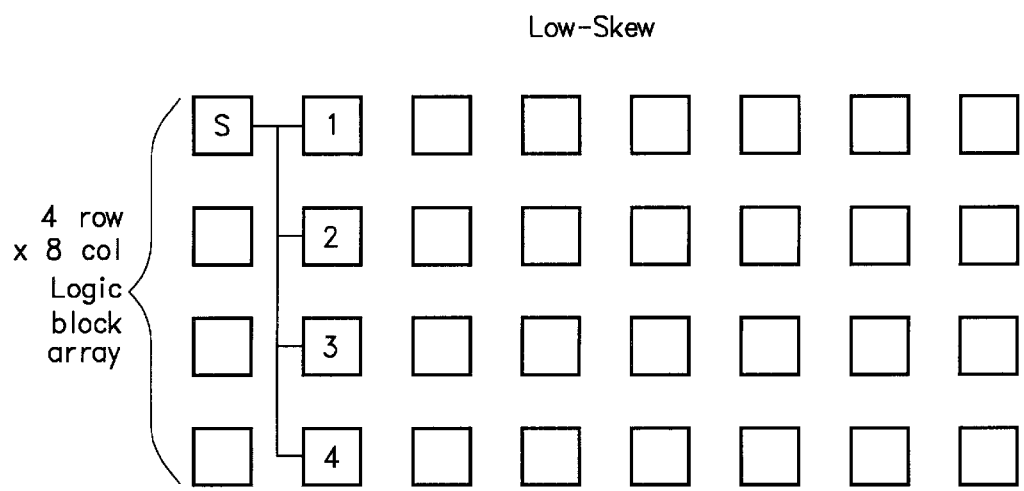
FIG. 6B illustrates an exemplary low-skew logic block array.

Timing skew is a measure of relative difference in route delays from a given source to a collection of destinations. A signal is low-skew if the delay times to all destinations is nearly equal. A signal is high-skew if the delay time to all destinations vary. Low-skew can be accomplished by using similar route resources for all segments of a signal. High-skew is incurred when signals are non-deterministically routed on routing resources. Thus, skew is often an indication of the destination type. For example, destinations serving different purposes often incur high-skew distribution of a signal, whereas destinations serving the same purpose often incur low-skew distribution of a signal. In FIG. 6A, the source signal S is routed to destinations 1–4 by different routing resources; thus, is high-skew. In FIG. 6B, the source signal S is routed to destinations 1–4 by similar routing resources; thus, the signal is low-skew.

Fan-in refers to the number of sources used to generate a signal. Signals having a small number of sources have a narrow fan-in, whereas signals having a large number of sources have a wide fan-in.

Organization refers to the pattern inherent in a logic function. For example, control logic is typically variable or unstructured in its organization, whereas, datapath logic is typically repetitious or uniform in its organization.

Whether certain logic is unstructured/control or structured/datapath logic can further be characterized by the number of inputs employed and the number of logic levels required to achieve a particular function. If the number of inputs is large (i.e., 5 or more) or if the inputs are random, then the logic is likely to be "wide," because the logic requires a large number of independent terms. For example, a state machine typically includes many conditions for returning to the start-up state. These conditions have equal or independent scope. Independence results in a small number (i.e., 3 or less) of logic levels; thus, the logic is also "shallow." If the number of inputs is small (i.e., 5 or less) or if the inputs are relative (i.e., from adjacent states), then the logic is "narrow," because the logic requires a large number of dependent terms. For example, an arithmetic object may have a dominant reset input upon which all other controls are dependent upon (i.e., reset must be unasserted for the other controls to contribute to a "next-state"). The arithmetic object may have a clock enable signal dominant over the remaining control lines. Dependency results in a large number (i.e., 6 or more) of logic levels; thus, the logic is also "deep."

Unstructured/control logic, such as state machines, often comprises non-uniform (random) logic most suitably mapped onto physical resources that has fine granularity, short route resource segments, and includes function generators that accept a large number of inputs and generate a small number of outputs. Such input functions can be referred to as "wide" and "shallow."

On the other hand, structured/datapath logic; such as counters, is inherently regular and frequently has large fan-in and large fan-out interconnect. Furthermore, datapath logic, being of fixed, limited, or pre-determined functionality, has next-state functions comprising a small number of input variables. Such input functions can be referred to as "narrow" and "deep."

Figure 8:
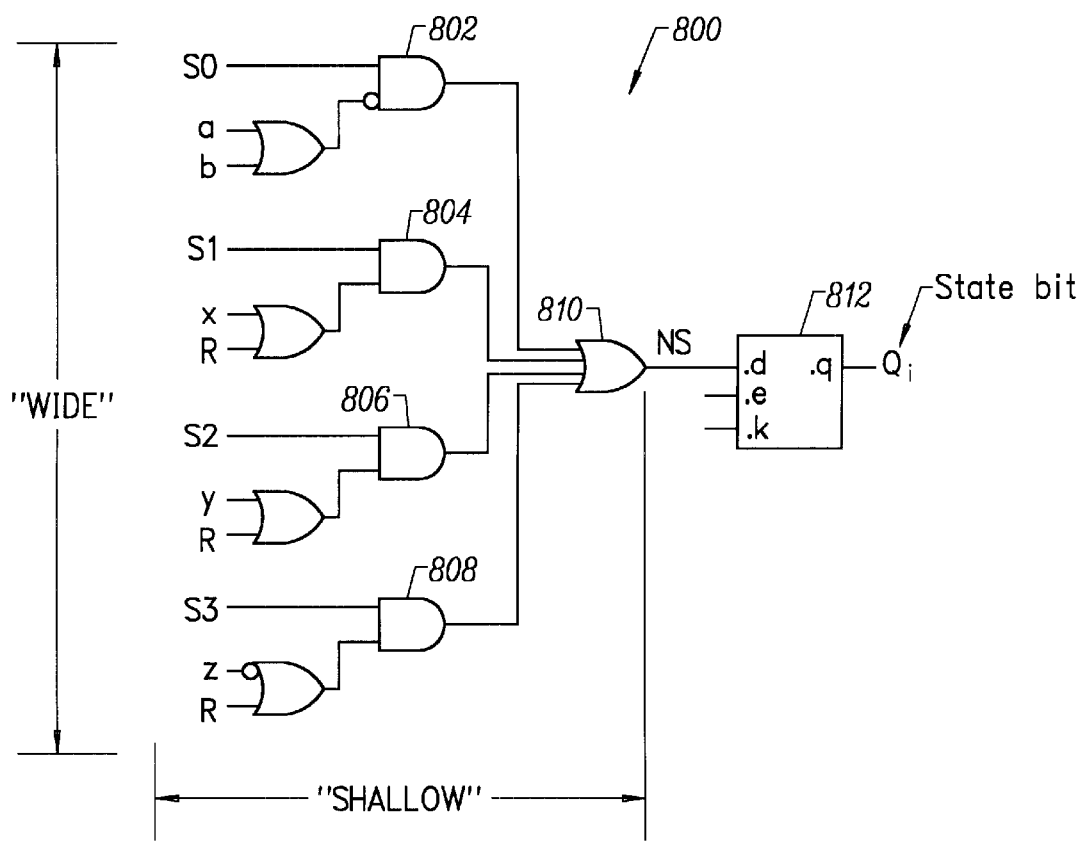
FIG. 8 illustrates an exemplary unstructured logic block.

FIG. 8 illustrates an exemplary unstructured/control logic block 800. The logic block 800 includes combinational logic that accepts a large number of inputs (i.e., S0, a, b, S1, x, R, etc.). Each output from AND gates 802, 804, 806, 808 carries independent weight as it is applied to a OR gate 810. The output of the OR gate 810 is latched into a flip-flop 812 which selectively provides a state bit Qi. The logic block 800 accepts a large number of inputs and generates a small number of outputs; thus, it is both "wide" and "shallow."

Figure 9:
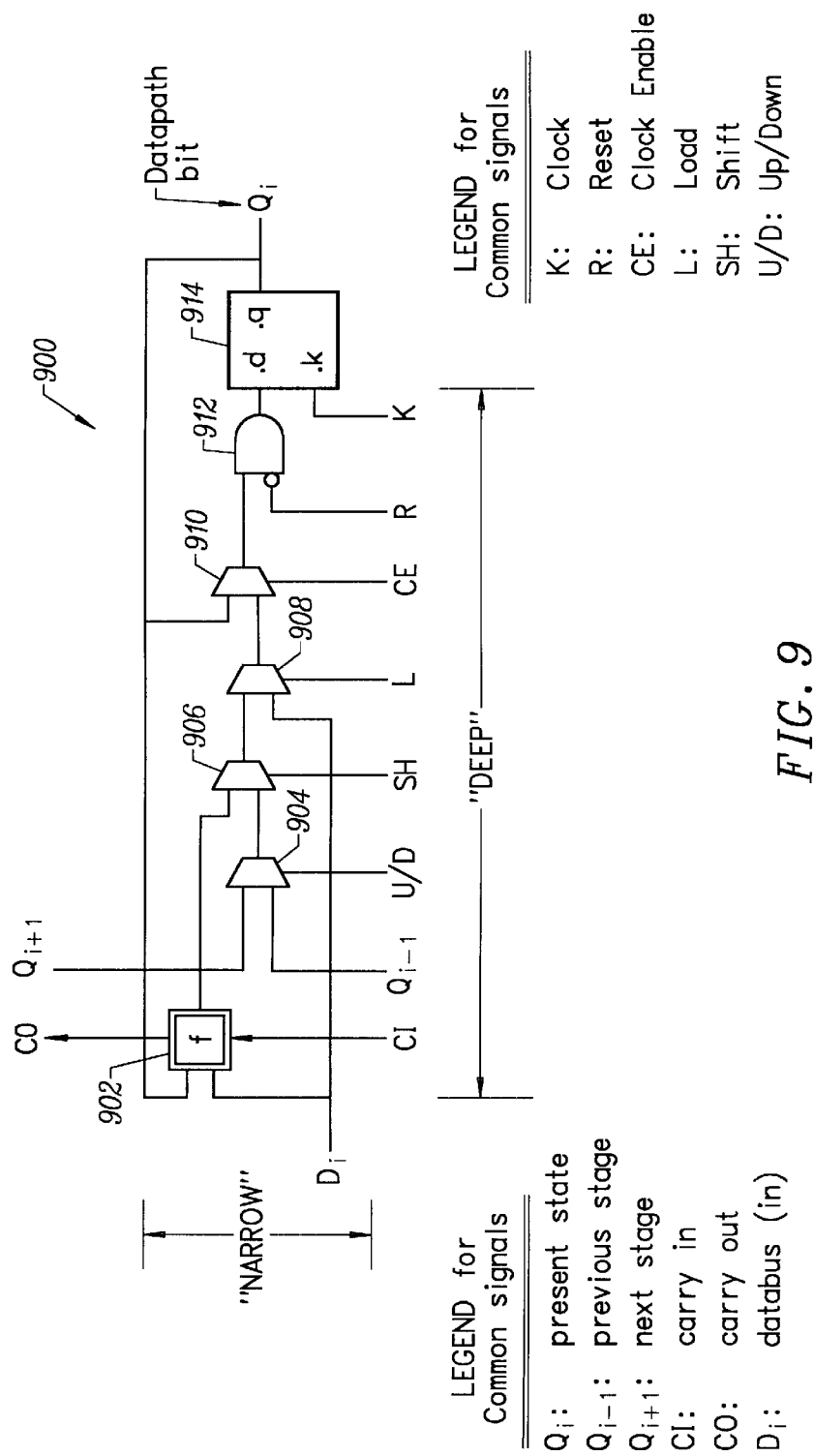
FIG. 9 illustrates an exemplary structured logic block.

FIG. 9 illustrates an exemplary structured/datapath logic block 900. The logic block 900 includes an arithmetic function circuit 902 such as an "Add" circuit, a plurality of multiplexers 904, 906, 908, 910 that are variably connected with different signal lines, an AND gate 912, and a flip-flop 914. As shown in FIG. 9, the various logic elements of logic block 900 are capable of receiving one input (Di) and various signals (as shown) to perform various datapath functions, such as a register function, a counter function, or other datapath functions. The logic block 900 accepts a small number of inputs (Di) and requires a large number of dependent terms. Dependency results in a large number of logic levels; thus, the logic block 900 is both "narrow" and "deep."

Suitable routing for unstructured/control logic comprises a variety of segment lengths from short to long. However, for unstructured/control logic, most interconnect segments are short. Thus, unstructured logic blocks should be interconnected with a predominance of short length routing resources. In an exemplary embodiment, unstructured logic blocks also need one type of long length interconnect that conveys output functions to structured logic blocks. This type of long length interconnect can be referred to as the control signal bus 110 (see FIG. 2). Typically, the control signal bus 10 conveys signals from an unstructured subsection to a structured (datapath) sub-section. Examples of the signals are output enable (OE), clock enable (CE), load (LD), shift (SH), add (ADD), increment (INC), and synchronous reset (R).

Figure 10:
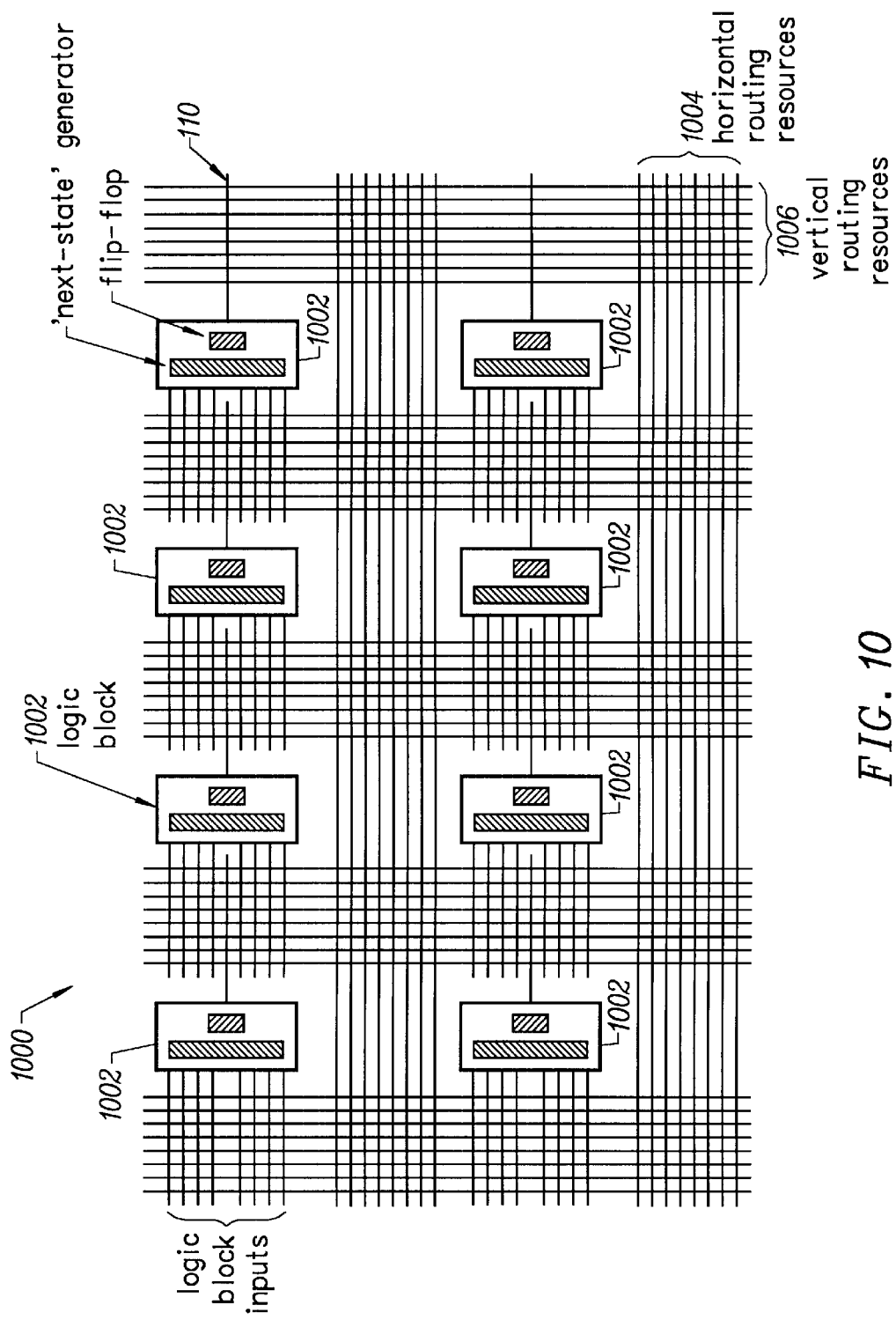
FIG. 10 illustrates an exemplary unstructured logic block array.

FIG. 10 illustrates an exemplary routing scheme for an unstructured/control logic array 1000. In FIG. 10, unstructured logic blocks 1002 are interconnected by short horizontal routing resources 1004 and short vertical routing resource 1006. Each logic block 1002 receives inputs via the horizontal routing resources 1004 and outputs to structured/datapath logic via the control signal bus 110. Further, each logic block 1002 is interconnected with other logic blocks 1002 within the control logic array 1000 via horizontal or vertical routing resources 1004, 1006.

Figure 11:
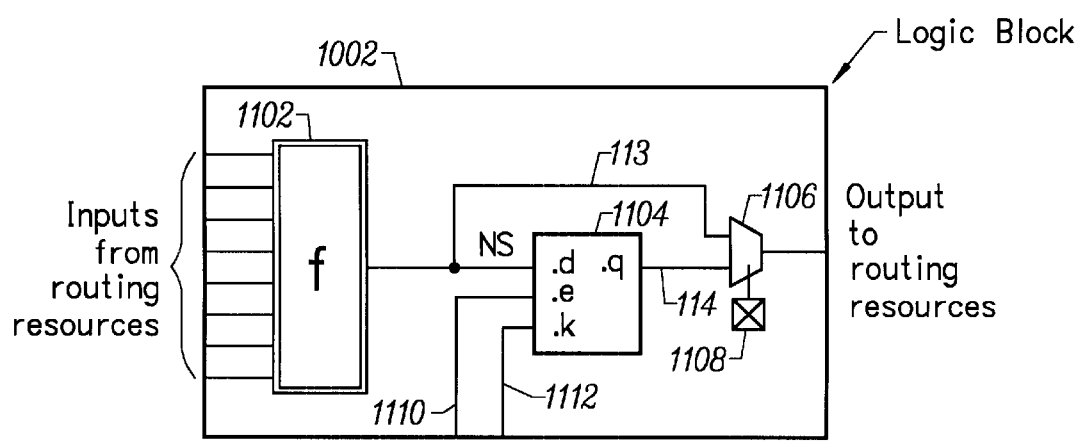
FIG. 11 illustrates an exemplary unstructured logic block.

FIG. 11 illustrates an exemplary unstructured/control logic block 1002. The logic block 1002 includes an eight-look-up table function generator 1102, a flip-flop 1104, a multiplexer 1106, and a configuration point 1108. The logic block 1002 receives inputs from horizontal or vertical routing resources 1004, 1006. Output from the look-up table function generator 1102 is forwarded to the flip-flop 1104 and the multiplexer 1106. The flip-flop 1104 selectively provides an output depending on signals received from signal lines 1110, 1112. The output from the flip-flop 1104 is applied to the multiplexer 1106. The multiplexer 1106 is configured by the configuration point 1108 to selectively transfer a signal from line 113 or line 114 to routing resources 1004, 1006.

Figure 12:
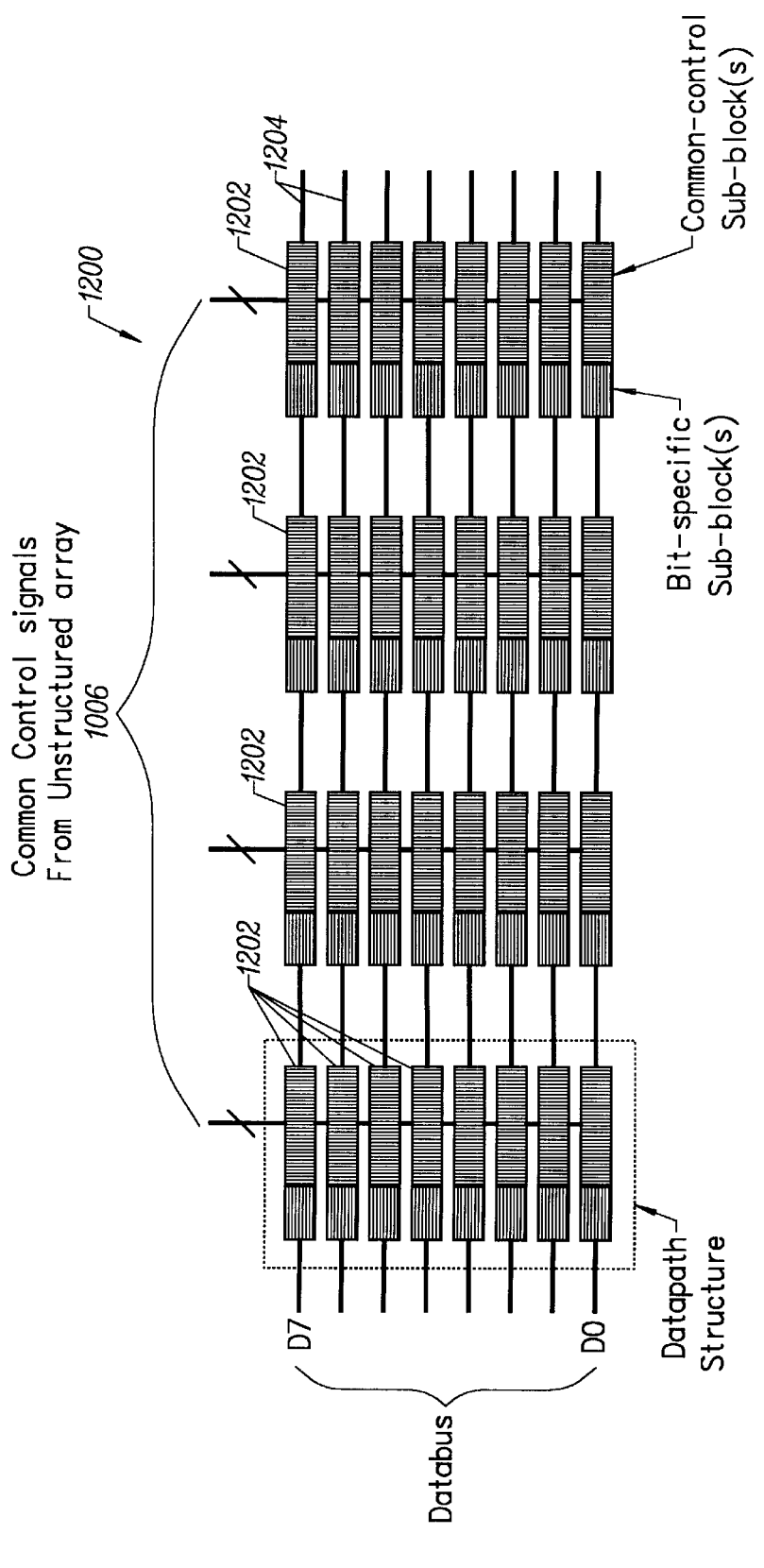
FIG. 12 illustrates an exemplary structured logic block array.

FIG. 12 illustrates an exemplary routing scheme for structured/datapath logic array 1200. The logic array 1200 includes structured logic blocks 1202. Each logic block 1202 includes input lines from and output lines to dedicated databuses 1204 and common control signals from unstructured sub-section 1006.

Figure 13:
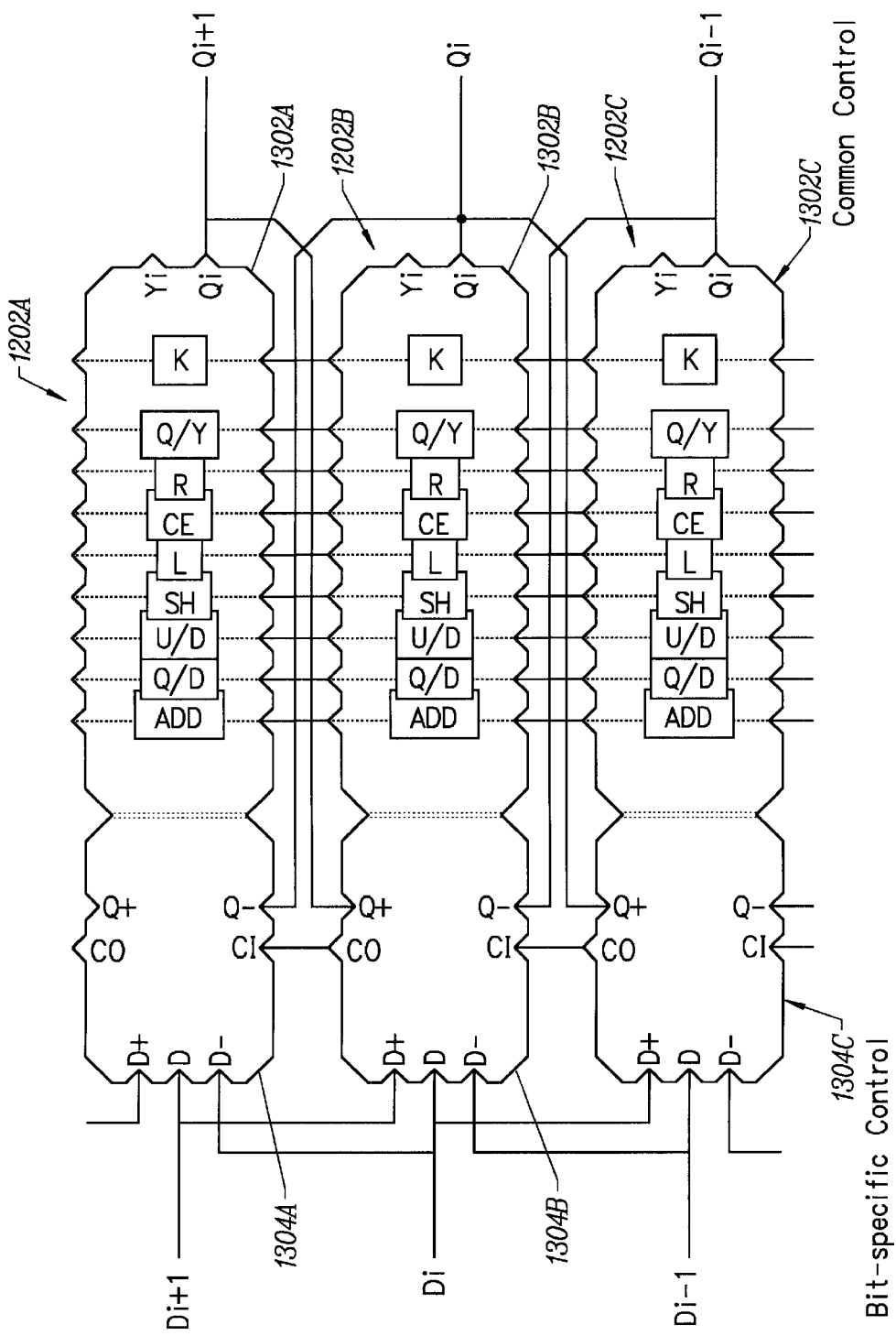
FIG. 13 illustrates exemplary structured logic blocks.

FIG. 13 illustrates three exemplary structured logic blocks 1202A, 1202B and 1202C. Each structured logic block 1202 includes two sub-blocks: (1) the common control sub-block 1302; and (2) the bit-specific control sub-block 1304. Each common control sub-block 1302 of the structured logic block 1202 includes as inputs control signals from an unstructured/control array in common with other structured logic blocks of the structured logic block array 1200. The controls include ADD (controls whether the block adds or subtracts), Q/D (controls whether adjacent-bit-Q from the logic block array or adjacent-bit-D from a bus may be shifted in), U/D (controls whether shifts are up or down), SH (controls whether to shift at all or not), L (controls whether to load or not), CE (controls whether to advance the state of Q), R (controls whether to reset Q), and Q/Y (which controls, whether to output the sequential result Q or the combinational result Y). The bit-specific sub-block 1304 does not receive inputs common to all other bit-slices of the structured logic block array 1200 except for the arithmetic function control (i.e., ADD). Instead, each bit-specific sub-block 1304 in a structured logic block 1202 receives inputs (e.g, databus bits) from the immediately adjacent structured logic blocks in the structured logic block array 1200. For example, bit-specific sub-block 1304B in logic block 1202B receives inputs from the adjacent databus bits, such as Di+1 or Di−1.

Figure 14:
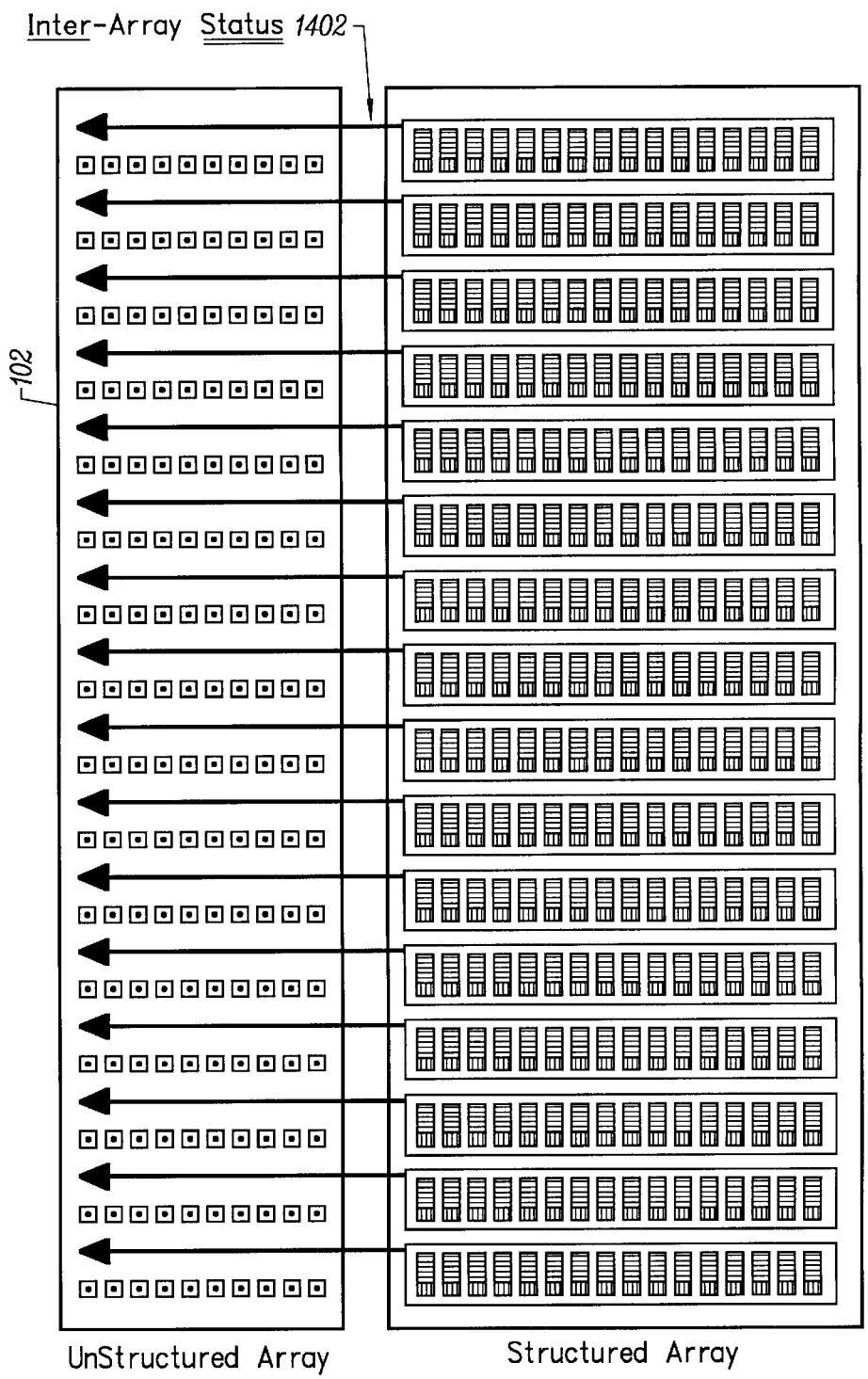
FIG. 14 illustrates an exemplary routing scheme for structured-to-unstructured status signals.

FIG. 14 illustrates an exemplary routing scheme from the structured/datapath logic block array 104 to the unstructured/control logic block array 102. In FIG. 14, a set of inter-array lines 1402 forming the bussed signal bus 112 (FIG. 2) provides status signals from the structured logic block array to the unstructured logic block array.

The unstructured logic block array 102 implements control logic, such as state machines, and is expected to receive inputs from a variety of off-chip sources. Typically, off-chip sources are not databus signals but are other status and control signals. Further inputs from off-chip sources are not manipulated by common control signals that control databus signals. Signals input into the unstructured logic block array 102 are generally random; thus, the I/O logic used to provide input and output of such signals need not be grouped together the way databus signals should be. The I/O associated with the unstructured logic block array 102 may be referred to as the unstructured input/output structure interconnect 106 (FIG. 2) or as unstructured I/O. The I/O associated with the structured logic block array 104 may be referred to as the bussed input/output structure interconnect 108 (FIG. 2) or as structured I/O.

Figure 15:
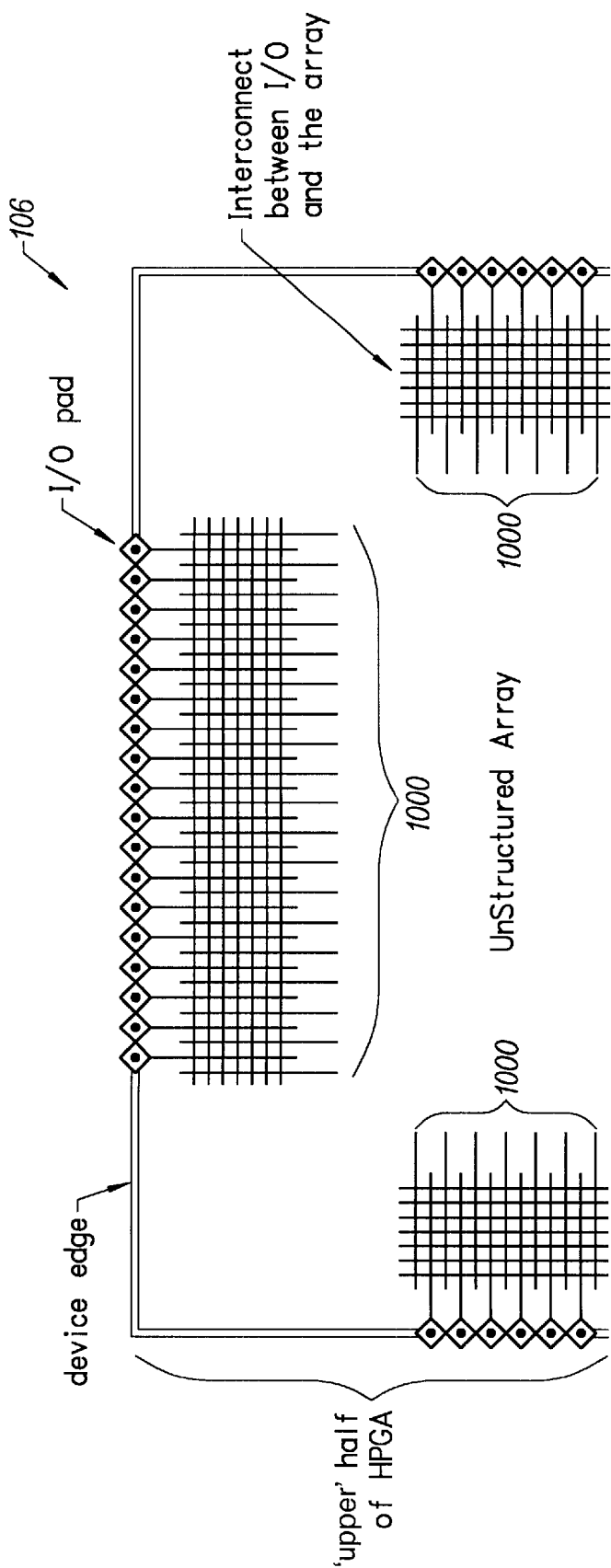
FIG. 15 illustrates an exemplary unstructured I/O in an unstructured logic block array.
Figure 16:
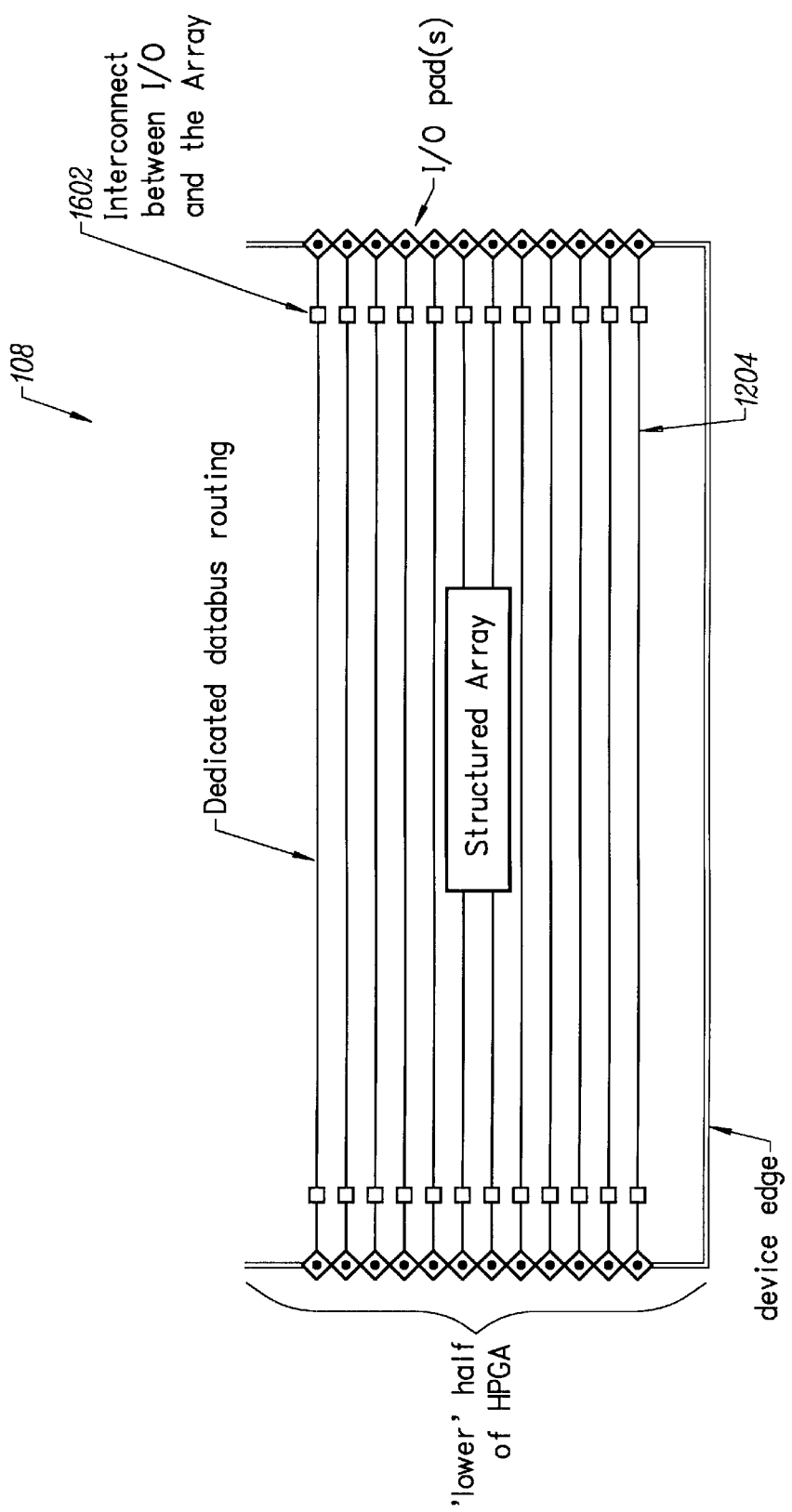
FIG. 16 illustrates an exemplary structured I/O in a structured logic block array.

A major difference between the unstructured and structured routing resources is that the structured logic block array 1200 includes dedicated bus routing segments 1204. In contrast, generally no dedicated routing resources (except for system clock and system reset) exist within the unstructured array 1000. In an exemplary embodiment, the structured logic block array 1200 has an additional level of hierarchy. The additional level of hierarchy consists of a collection of structured logic blocks related by a common set of control signals. It is advantageous to arrange this hierarchy of structured logic blocks to form columnar-type objects. The unstructured logic block array 1000 has no such levels of hierarchy. Unstructured I/O comprises simple I/O drivers and receivers not controlled by a dedicated common signal (other than system clock(s) and system reset(s)). In contrast, structured I/O comprises drivers and receivers which are controlled by dedicated common signals such as clock enable (CE) and output enable (OE). Further, the unstructured I/O should have the ability to distribute signals any where within the unstructured array. FIG. 15 illustrates an exemplary unstructured I/O 106 for the unstructured logic block array 1000. In contrast, the structured I/O should have the ability to input and output a structured logic block's associated databus bit signal. FIG. 16 illustrates an exemplary structured I/O 108 for the structured logic block array 1200. In FIG. 16, the structured I/O 108 includes programmable interconnect 1602 and dedicated databus routing lines 1204.

Those skilled in the art will recognize a number of benefits associated with the device of the invention. First, the invention provides a platform for disparate programmable logic and routing resources. This topology facilitates superior partitioning of contemporary netlists. That is, logic netlists can be partitioned into fragments specifically targeting sub-array resources. Appropriate partitioning results in significantly increased device utilization and system performance. The unitary device of the invention reduces manufacturing and packaging costs. Advantageously, signals can be quickly passed between the unstructured logic sub-array and the structured logic sub-array, which are formed on a single functional chip.

The foregoing examples illustrate certain exemplary embodiments of the invention from which other embodiments, variations, and modifications will be apparent to those skilled in the art. The invention should therefore not be limited to the particular embodiments discussed above, but rather is defined by the following claims.

What is claimed is:

1. A heterogeneous programmable gate array comprising:

an unstructured logic sub-array of identical unstructured logic elements in a first contiguous area of said programmable gate array;

an unstructured input/output interconnect structure to deliver unstructured-to-unstructured input/output signals only to elements of said unstructured logic sub-array;

a structured logic sub-array of identical structured logic elements in a second contiguous area of said programmable gate array, said elements of said structured logic sub-array being complementary to said elements of said unstructured logic sub-array;

a bussed input/output interconnect structure to deliver structured-to-structured input/output signals only to elements of said structured logic sub-array;

a control signal bus coupled between said unstructured logic sub-array and said structured logic sub-array to deliver unstructured source signals therebetween; and a bussed signal bus connected between said unstructured logic sub-array and said structured logic sub-array to deliver structured source signals therebetween.

2. The heterogeneous programmable gate array of claim 1, wherein said unstructured logic sub-array implements a state machine.

3. The heterogeneous programmable gate array of claim 1, wherein said unstructured logic sub-array implements a decoder.

4. The heterogeneous programmable gate array of claim 1, wherein said unstructured logic sub-array is characterized by routing resources that are dense, short, low fan-out, and high skew.

5. The heterogeneous programmable gate array of claim 1, wherein said structured logic sub-array implements an arithmetic function.

6. The heterogeneous programmable gate array of claim 1, wherein said structured logic sub-array implements a storage register.

7. The heterogeneous programmable gate array of claim 1, wherein said structured logic sub-array implements random access memory.

8. The heterogeneous programmable gate array of claim 1, wherein said structured logic sub-array is characterized by routing resources that are sparse, long, high fan-out, and low skew.

9. The heterogeneous programmable gate array of claim 1, wherein said gate array includes approximately one-tenth to four-tenths unstructured logic sub-array circuitry and approximately nine-tenths to six-tenths structured logic sub-array circuitry.

* * * * *